United States Patent
Schuetz et al.

(10) Patent No.: US 7,889,578 B2
(45) Date of Patent: Feb. 15, 2011

(54) SINGLE-STROBE OPERATION OF MEMORY DEVICES

(75) Inventors: Roland Schuetz, Ottawa (CA); Jin-Ki Kim, Kanata (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 732 days.

(21) Appl. No.: 11/873,475

(22) Filed: Oct. 17, 2007

(65) Prior Publication Data

US 2009/0103378 A1 Apr. 23, 2009

(51) Int. Cl.
*G11C 7/00* (2006.01)

(52) U.S. Cl. .................. 365/193; 365/191; 365/230.05; 365/233.11

(58) Field of Classification Search ................ 365/193, 365/191, 194, 189.08, 189.07, 230.02, 233, 365/230.05, 233.11, 233.12, 233.19
See application file for complete search history.

(56) References Cited

U.S. PATENT DOCUMENTS

| | | | |
|---|---|---|---|
| 4,174,536 A | 11/1979 | Misunas et al. | |
| 4,796,231 A | 1/1989 | Pinkham | |
| 4,899,316 A | 2/1990 | Nagami | |
| 5,778,419 A | 7/1998 | Hansen et al. | |
| 6,091,660 A | 7/2000 | Sasaki et al. | |
| 6,317,350 B1 | 11/2001 | Pereira et al. | |
| 6,950,350 B1 * | 9/2005 | Kerl | 365/193 |
| 7,130,958 B2 | 10/2006 | Chou et al. | |
| 7,796,462 B2 * | 9/2010 | Pyeon | 365/230.08 |
| 2005/0024369 A1 | 2/2005 | Xie | |
| 2006/0034134 A1 * | 2/2006 | Choi et al. | 365/193 |
| 2006/0215670 A1 | 9/2006 | Sampath et al. | |
| 2007/0076479 A1 | 4/2007 | Kim et al. | |
| 2007/0076502 A1 | 4/2007 | Pyeon et al. | |
| 2007/0109833 A1 | 5/2007 | Pyeon et al. | |
| 2007/0153576 A1 | 7/2007 | Oh et al. | |
| 2008/0019189 A1 | 1/2008 | Lin | |
| 2008/0019196 A1 | 1/2008 | Lin | |

OTHER PUBLICATIONS

Institute of Electrical and Electronics Engineers, Inc., IEEE Standard for High-Bandwidth Memory Interface Based on Scalable Coherent Interface (SCI) Signaling Technology (Ramlink), IEEE Standards Board, Mar. 19, 1996, New York, United States of America.

* cited by examiner

*Primary Examiner*—Richard Elms
*Assistant Examiner*—Hien N Nguyen
(74) *Attorney, Agent, or Firm*—Ridout & Maybee LLP

(57) ABSTRACT

An arrangement of memory devices and a controller is based on an interface with a reduced pin count relative to a known memory device and controller arrangement. Facilitating the reduced pin count interface the reduction of multiple strobe signal to a single strobe signal. In addition, a packet header transmitted on the data bus followed by a payload, includes an encoded indication of the type of the payload. Aspects of the present application relate to providing a traditional memory device with external logic devices, where the logic devices handle the single strobe and the packet header, thereby permitting single strobe operation.

20 Claims, 13 Drawing Sheets

SINGLE-STROBE OPERATION OF MEMORY DEVICES

FIELD

The present application relates generally to a controller and at least one controlled memory device and, more specifically, to methods and apparatus adapting the controller and the memory device to a single-strobe mode of operation.

BACKGROUND

In a typical electronic memory arrangement, reading from and writing to several memory devices is organized by a controller. Double-data-rate synchronous dynamic random access memory (DDR SDRAM) is an example of such an arrangement. For a write operation, the controller places data on a data bus while indicating, on a command bus, a write command, and indicating, on an address bus, a location on the particular memory device at which the data is to be stored. For a read operation, the controller indicates, on the command bus, a read command, and indicates, on an address bus, a location on the particular memory device from which the data is to be read. The memory device responds to the read command and address by placing the requested read data on the data bus.

In contrast, in an alternative electronic memory arrangement, memory devices are arranged in a ring or loop. Rather than a data bus accessed in parallel, there is a series data connection between a controller and a first memory device in the ring. The data connection may, for example, be a multibit bus. A data signal received at the first memory device on the data connection is passed on to a second memory device on an other data connection and a data signal received at the second memory device on the other data connection is passed on to a third memory device on a further data connection, etc. Thus, the data signal propagates around the ring until the data signal is returned to the controller. In addition to the data signal propagating through the ring, there are additional signals also propagating through the ring: a Command Strobe signal; and a Data Strobe signal.

For a write operation, the controller causes the Command Strobe signal to transition from "0" to "1" to indicate the start of a Command and Write Data Packet. Simultaneously, the controller starts to transmit, on the data connection, a Command and Write Data Packet that includes: a write command indicating a particular memory device and address to which data is to be written followed by the data that is to be written. The controller then causes the Command Strobe signal to transition from "1" to "0" to indicate the end of the Command and Write Data Packet.

For a read operation, the controller causes the Data Strobe signal to transition from "0" to "1" to indicate the start of a Read Data Packet. Simultaneously, the controller starts to transmit, on the data connection, a read data packet that includes: a read command indicating a particular memory device and address from which the data is to be read. The controller then causes the Command Strobe signal to transition from "1" to "0" to indicate the end of the Read Data Packet. Subsequently, the controller causes the Data Strobe signal to transition from "0" to "1" to indicate, to the particular memory device, that the requested read data is be transmitted on the data connection.

In the ring arrangement, a read command primes a memory device for a read data transfer. The length of a read is arbitrary and interruptible since the end of the read data transfer operation is determined by a transition of the Data Strobe signal from "1" to "0". Similarly, the length of a write is arbitrary and interruptible since the end of the write data transfer operation is determined by a transition of the Command Strobe signal from "1" to "0".

As discussed, when memory devices are arranged in a ring, packets originate at a controller and flow unidirectionally through a ring of memory devices and back to the controller. Different configurations are possible based on either distributing a clock in parallel or sourcing the clock synchronously along with the data and strobes. The second configuration has more pin overhead than the first configuration based on extra differential clock output pins.

Pin overhead continues to be a carefully monitored quality of interfaces between devices, such as the interface between the controller and the first memory device or between memory devices, with a lower pin overhead being desirable. That is, it is desirable to reduce the ratio of control pins to data pins.

BRIEF DESCRIPTION OF THE DRAWINGS

Reference will now be made to the drawings, which show by way of example, embodiments of the invention, and in which.

DETAILED DESCRIPTION OF THE EMBODIMENTS

Figure 1:
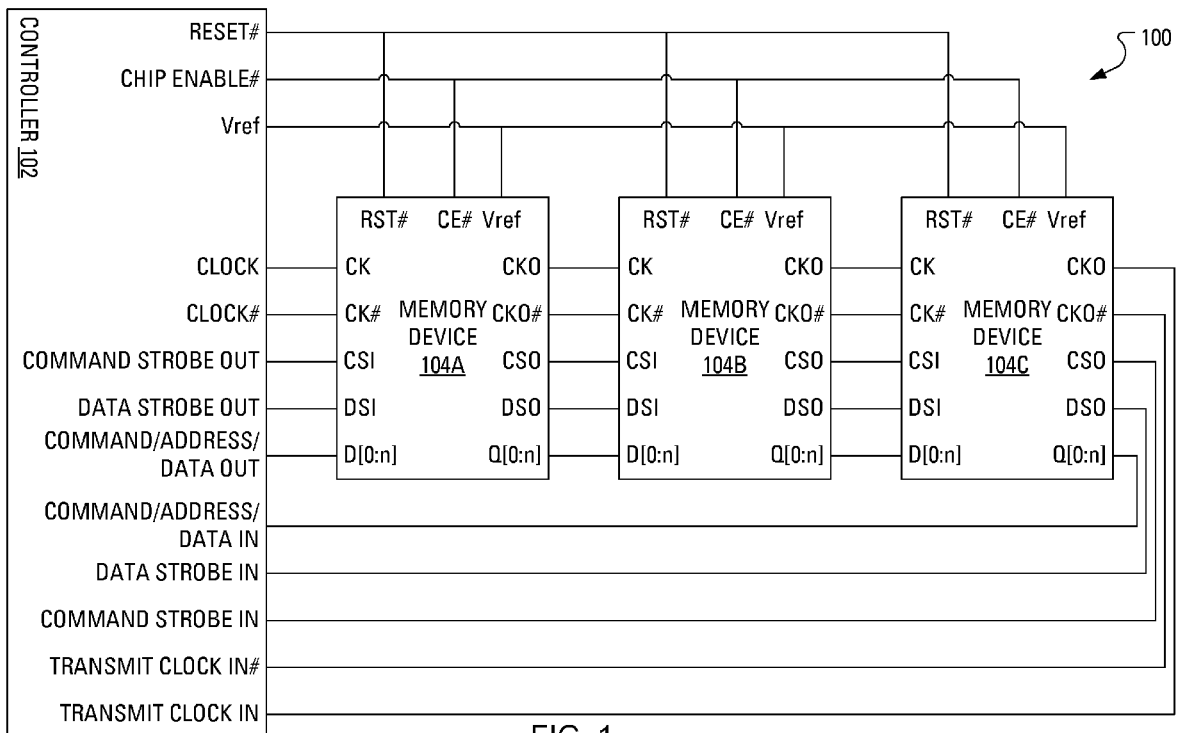
FIG. 1 illustrates a ring arrangement of memory devices configured for parallel clock distribution.

The total number of signal inputs (e.g., pins) on a semiconductor memory device may be reduced through the use of a unique interface design. Operation with only one strobe signal pin may be accomplished, without reducing functionality, through the transmission of a primary packet that includes a "packet header" and a payload, where the packet header contains encoded information about the type of the payload. the payload, may, for instance, be a secondary packet, e.g., the original packet that would have been transmitted in a system using more than one strobe.

The inclusion of information about the type of the payload, as encoded in this packet header, facilitates operation of the device with only one strobe signal, where, before, more than one strobe signal was necessary. Previously, each function or type of command has been associated with a distinct strobe signal. Aspects of the present application relate to wrapping a traditional memory device with logic devices, where the logic devices handle the single strobe and the packet header, thereby permitting single strobe operation.

In accordance with an example embodiment, there is provided a method of controlling a memory device. The method includes transmitting a strobe signal delimiting a primary packet and concurrently transmitting said primary packet on a data bus, the primary packet including a packet header followed by a payload, the packet header indicating a type to be associated with the payload. In other example embodiments, a memory device controller is provided for carrying out this method and a computer readable medium is provided for adapting a memory device controller to carry out this method.

In accordance with an example embodiment, there is provided a memory device. The memory device includes an internal memory device and a packet header decoder. The internal memory device includes a plurality of data bus inputs for receiving a signal on a data bus, a first strobe input for receiving a first strobe signal indicating that the signal on the data bus relates to a first type of packet and a second strobe input for receiving a second strobe signal indicating that the signal on the data bus relates to a second type of packet. The packet header decoder includes a clock input for receiving a system clock signal, an inverse clock input for receiving an inverse system clock signal, a data bus input for receiving a portion of the signal on the data bus, a third strobe input for receiving a third strobe signal, a pulse generator for generating a fourth strobe signal based on the inverse system clock signal and the third strobe signal and a strobe generator for generating one of the first strobe signal and the second strobe signal based on: the system clock signal; the portion of the signal on the data bus; and the fourth strobe signal.

In accordance with an example embodiment, there is provided a memory arrangement. The memory arrangement including a memory controller and a memory device. The memory controller includes a strobe output for transmitting a third strobe signal delimiting a primary packet and a plurality of data bus outputs for transmitting the primary packet on a data bus, the primary packet including a packet header followed by a payload, the packet header indicating a type to be associated with the payload. The memory device includes an internal memory device and a packet header decoder. The internal memory device includes a plurality of data bus inputs for receiving the primary packet on the data bus, a first strobe input for receiving a first strobe signal indicating that the signal on the data bus relates to a first type of packet and a second strobe input for receiving a second strobe signal indicating that the signal on the data bus relates to a second type of packet. The packet header decoder includes a clock input for receiving a system clock signal, an inverse clock input for receiving an inverse system clock signal, a data bus input for receiving a portion of the primary packet on the data bus, a third strobe input for receiving the third strobe signal, a pulse generator for generating a fourth strobe signal based on the inverse system clock signal and the third strobe signal and a strobe generator for generating one of the first strobe signal and the second strobe signal based on: the system clock signal; the portion of the primary packet on the data bus; and the fourth strobe signal.

In an arrangement 100 illustrated in FIG. 1, a first memory device 104A, a second memory device 104B and a third memory device 104C (collectively or individually 104) are in a ring or loop arrangement. Operation of the memory devices 104 for writing or reading is organized by a controller 102. The controller 102 may, as is typical, include a processor (not shown) and the processor may be provided with computer readable instructions for executing methods exemplary of the present application from a software medium (not shown) which could be a disk, a tape, a chip, a flash memory card or a random access memory containing a file downloaded from a remote source.

The controller 102 is connected to the first memory device 104A by way of a Command Strobe Line, a Data Strobe Line and a data bus. Similarly, the first memory device 104A is connected to the second memory device 104B by way of a Command Strobe Line, a Data Strobe Line and a data bus. It follows that the second memory device 104B is connected to the third memory device 104C by way of a Command Strobe Line, a Data Strobe Line and a data bus. Finally, the third memory device 104C is connected to the controller 102 by way of a Command Strobe Line, a Data Strobe Line and a data bus. The controller 102 is also connected to each of the memory devices 104, in parallel, by a Reset line, a Chip Enable line, a Clock line and an inverse Clock line.

Figure 2:
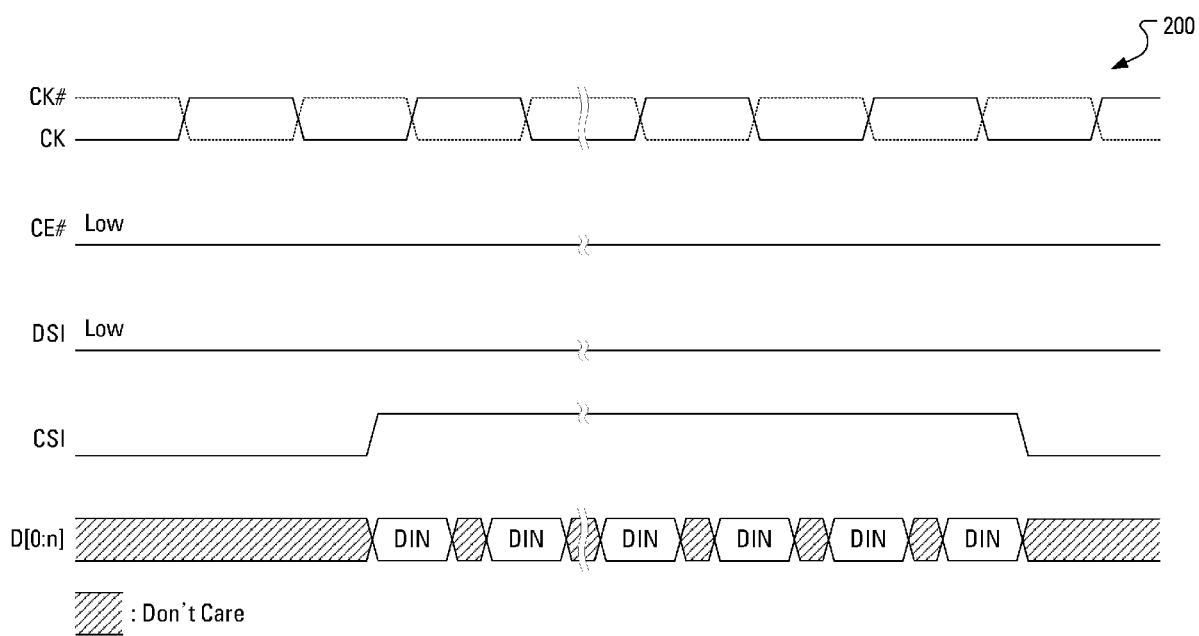
FIG. 2 illustrates a timing diagram for Command and Write Data Packet timing for the arrangement of FIG. 1.

In a timing diagram 200 in FIG. 2, "Command and Write Data Packet" timing is illustrated for the arrangement 100 of FIG. 1. Inputs to the memory device 104 on the (possibly multibit) data bus may be representative of a command, representative of data, representative of a target device address, or representative of an address within the memory device. Inputs on the data bus may be captured (shifted in to registers) on the crossing of the signal on the System Clock line (CK) with the signal on the Inverted System Clock line (CK#) when the signal on the Chip Enable (CE#) line is at a logical LOW and the signal on the Command Strobe line (received at the CSI pin) is at a logical HIGH.

Figure 3:
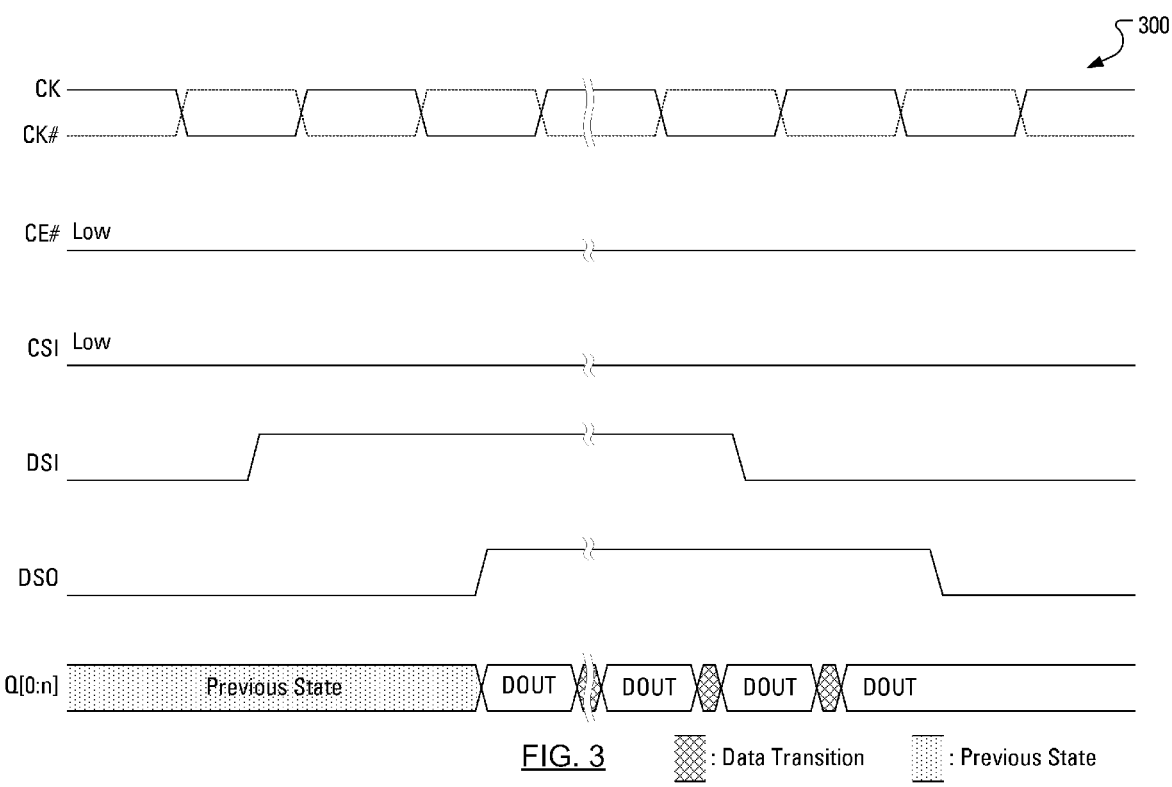
FIG. 3 illustrates a timing diagram for a Read Data Packet timing for the arrangement of FIG. 1.

In a timing diagram 300 in FIG. 3, "Read Data Packet" timing is illustrated for the arrangement 100 of FIG. 1. Output on the data bus may be synchronously shifted out at the crossing of the signal on the System Clock line (CK) with the signal on the Inverted System Clock line (CK#) when the signal on the Chip Enable (CE#) line is at a logical LOW and the signal on the Data Strobe line (received at the Data Strobe In, "DSI", pin) is at a logical HIGH. There is a fixed latency in the memory from the time the logical HIGH on the DSI pin is received and when a logical HIGH on the DSO pin and the accompanying read data are output.

Figure 4:
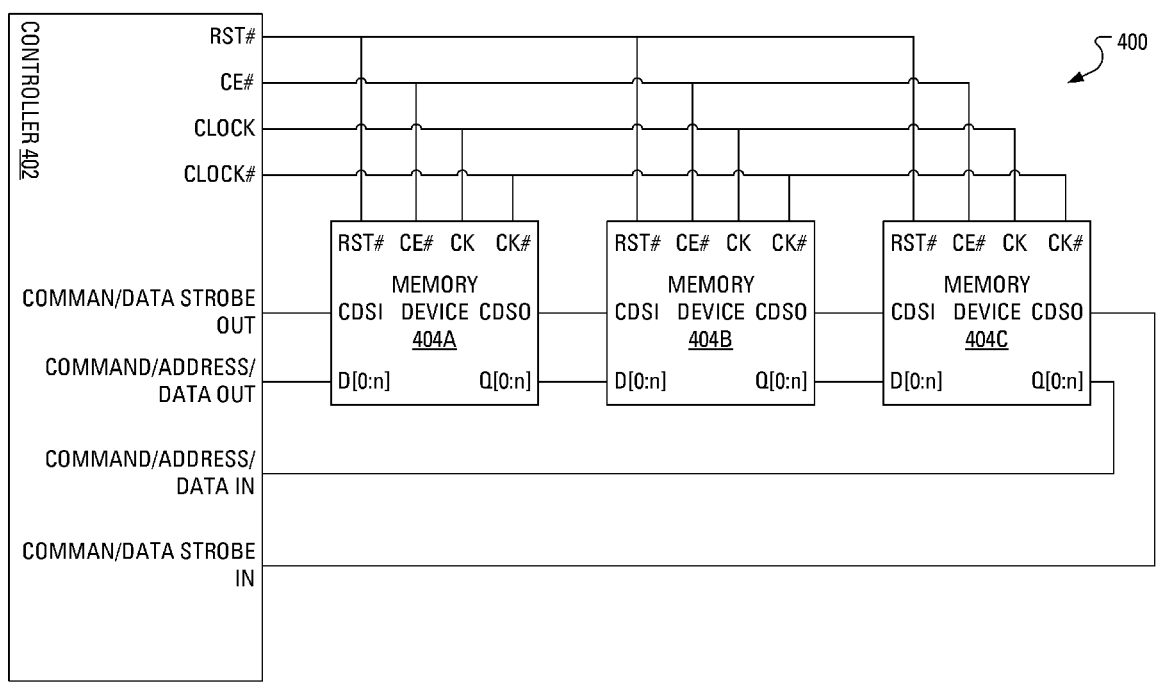
FIG. 4 illustrates an arrangement of memory devices configured for parallel clock distribution according to example embodiments.

In an arrangement 400 illustrated in FIG. 4, a first memory device 404A, a second memory device 404B and a third memory device 404C (collectively or individually 404) are in a ring or loop arrangement. Operation of the memory devices 404 for writing or reading is organized by a controller 402.

The controller 402 is connected to the first memory device 404A by way of a unidirectional, point-to-point data bus and a Command/Data Strobe line. Similarly, the first memory device 404A is connected to the second memory device 404B by way of a unidirectional, point-to-point data bus and a Command/Data Strobe line. It follows that the second memory device 404B is connected to the third memory device 404C by way of a unidirectional, point-to-point data bus and a Command/Data Strobe line. Finally, the third memory device 404C is connected to the controller 402 by way of a unidirectional, point-to-point data bus and a Command/Data Strobe line. The controller 402 is also connected to each of the memory devices 404, in parallel, by a Reset line, a Chip Enable line, a Clock line and an inverse Clock line.

Figure 5:
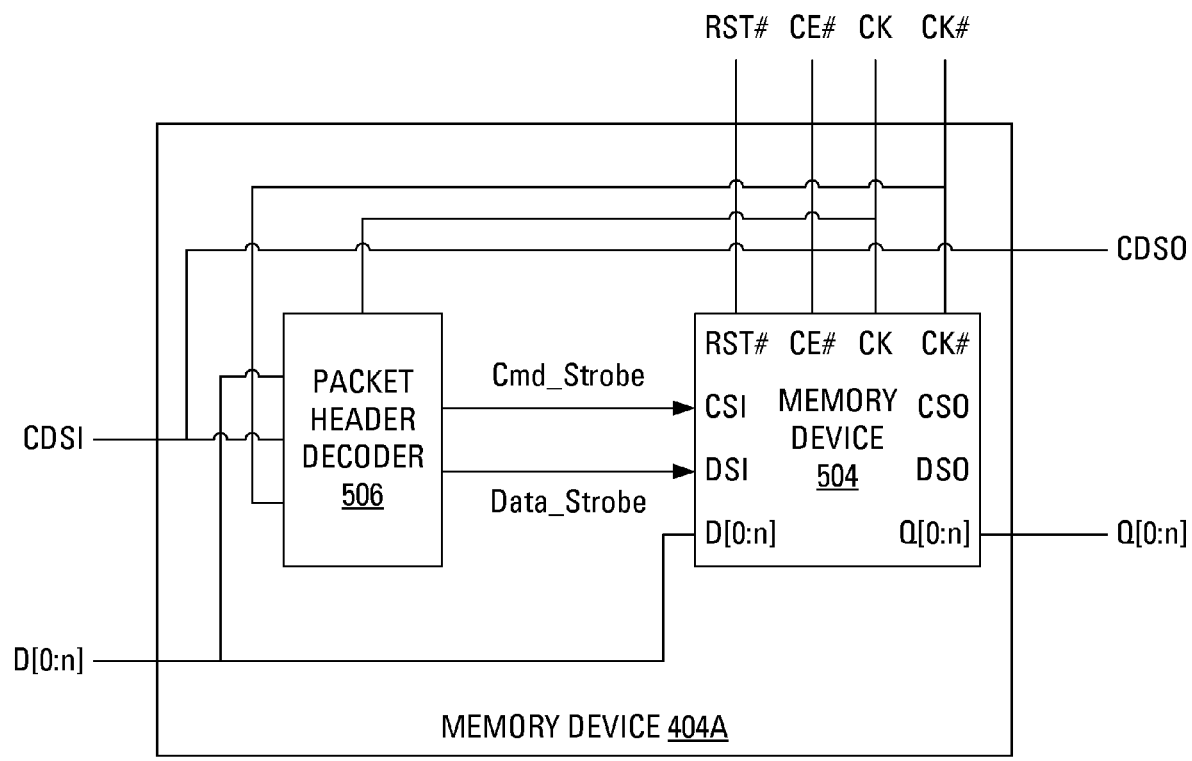
FIG. 5 illustrates a memory device for use in the arrangement of FIG. 4 according to example embodiments.

FIG. 5 illustrates an example structure for the first memory device 404A and, correspondingly, the other memory devices 404. In particular, the first memory device 404A includes a traditional memory device 504, such as the first memory device 104A used in the memory device arrangement 100 of FIG. 1. Positioned between the traditional memory device 504 and an input pin interface is a packet header decoder 506. The packet header decoder 506 receives input from the CDSI pin, the data bus pins (D[0:n]) and the inverted system clock pin (CK#). The traditional memory device 504 receives input in the form of either a command strobe or a data strobe from the packet header decoder 506 and receives input from the data bus pins (D[0:n]).

Figure 6:
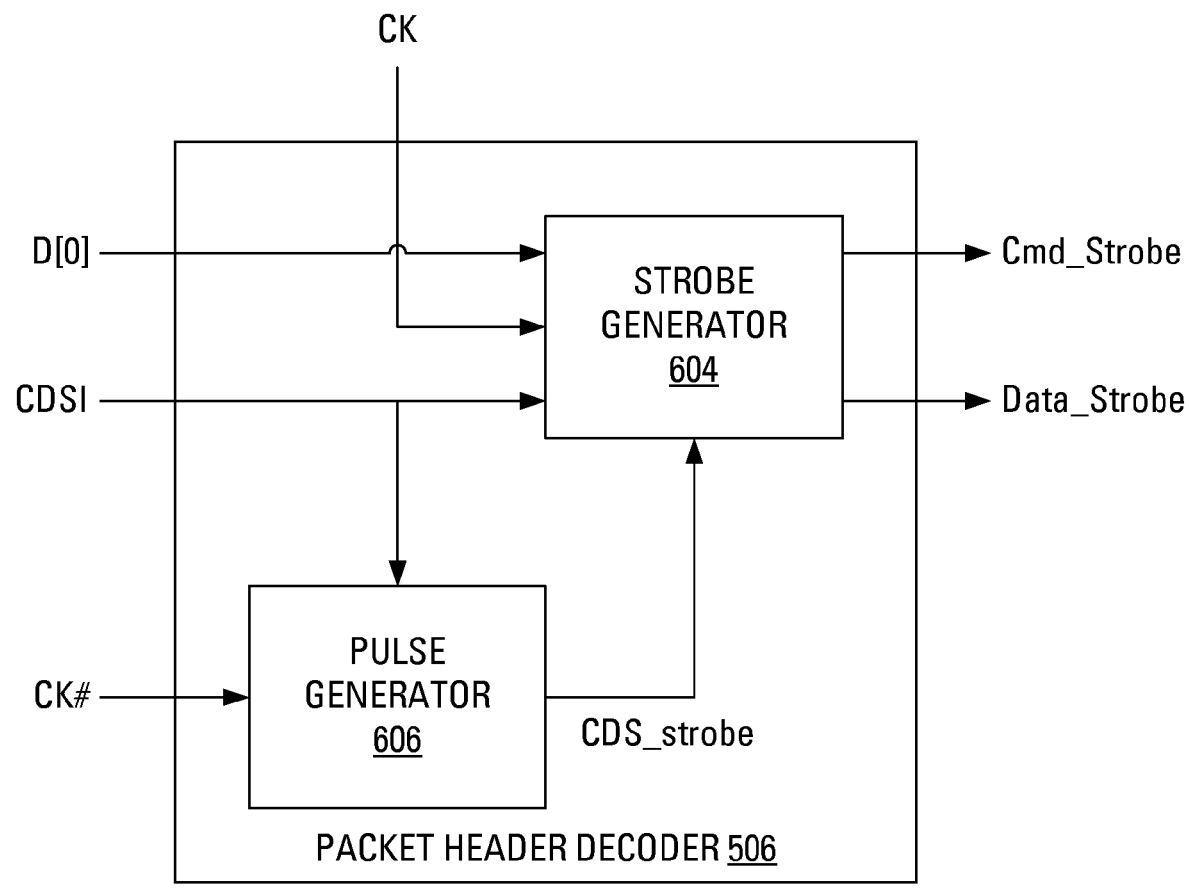
FIG. 6 illustrates a packet header decoder for use in the memory device of FIG. 5 according to example embodiments.

FIG. 6 illustrates an example structure for the packet header decoder 506 of FIG. 5 as including a strobe generator 604 and a pulse generator 606. The strobe generator 604 receives input from the CDSI pin, from the least significant data bus pin (D[0]) of the data bus pins (D[0:n]) and from the pulse generator 606. Note that the use of the least significant data bus pin (D[0]) is representative of a one-bit packet header being employed to encode information to be used by the packet header decoder 506 to distinguish between types of strobe signals. In an alternative embodiment, a different data bus pin (D[m], 0<m≦n) may carry the one-bit packet header. From these inputs, the strobe generator 604 produces either the Cmd_Strobe signal or the Data_Strobe signal. The pulse generator 606 receives input from the CDSI pin and the inverted system clock pin (CK#) and generates a pulse, called "CDS_strobe" herein, for use by the strobe generator 604. The output of the strobe generator 604, and, accordingly, the output of the packet header decoder 506, is either a Cmd_Strobe signal or a Data_Strobe signal.

Note that the packet header may be longer than one bit. In the current application, the packet header is distinguishing between two strobes and need only by one bit.

With a one-bit data bus, the packet header will contain two bits: a first bit for the positive edge of the clock; and a second bit for the negative edge of the clock. The first bit is the encoded bit for distinguishing between two strobes and the second bit is a "don't care" bit. Alternatively, the don't care bit could be used to convey other information such as distinguishing between a register read and a memory page read.

With an eight-bit data bus, the packet header will contain sixteen bits: a first bit, of the eight bits available on the positive edge of the clock, being the encoded bit for distinguishing between two strobes; the remaining seven bits of the eight bits available on the positive edge of the clock, being don't care bits; and eight don't care bits available on the negative edge of the clock. accordingly, there are 15 don't care bits that could be used to transfer encoded information regarding additional parameters. Using the don't care bits, it becomes possible to insert a portion of the payload into the packet header. Example contents may include the Device Address (DA) thereby allowing for early decoding.

It should be clear that, if more than two strobes were to be distinguished, more than one bit, of the bits available in the packet header, would be used for such distinguishing.

Figure 7:
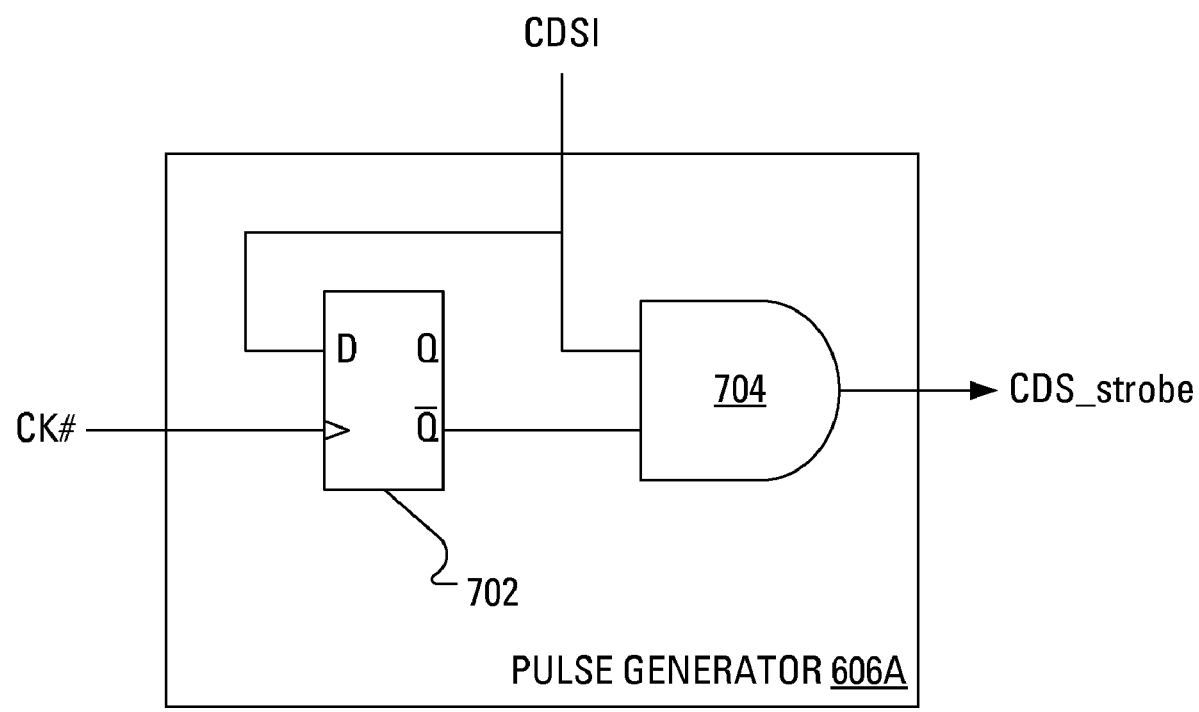
FIG. 7 illustrates a first pulse generator for use in the packet header decoder of FIG. 6 according to example embodiments.

FIG. 7 illustrates a first example structure 606A for the pulse generator 606 of FIG. 6. As illustrated in FIG. 6, the first example pulse generator 606A is implemented as an edge detection circuit based on a positive-edge-triggered flip-flop 702 clocked off of the inverted system clock. In particular, the positive-edge-triggered flip-flop 702 receives input from the CDSI pin at a "D" input and the inverted system clock at a clock input. The positive-edge-triggered flip-flop 702 produces an output Q and an inverted output $\overline{Q}$. An AND gate 704 receives input from the CDSI pin and input from the inverted output $\overline{Q}$ of the positive-edge-triggered flip-flop 702. The output of the AND gate 704, and, accordingly, the output of the first example structure 606A for the pulse generator 606, is the internal strobe signal CDS_strobe.

As will be understood by those with standard knowledge in digital circuit design, due to an extra level of logic having been added to the input to the memory device 504, the controller 102 may be arranged to provide enough setup time for the strobe generator 604 to latch the CDS_strobe signal and generate either the Cmd_Strobe signal or the Data_Strobe signal. That is, all pins/logic have setup time requirements.

Figure 8:
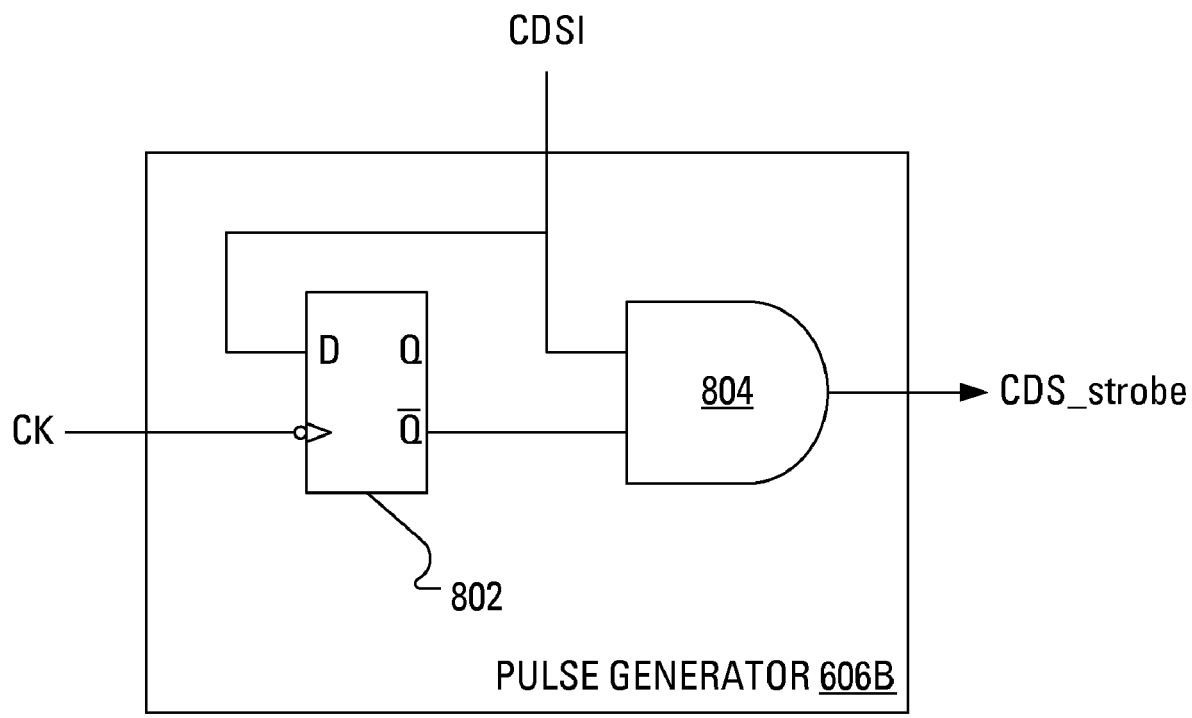
FIG. 8 illustrates a second pulse generator for use in the packet header decoder of FIG. 6 according to example embodiments.

FIG. 8 illustrates a second example structure 606B for the pulse generator 606 of FIG. 6. The second example pulse generator 606B is illustrated as implemented as an edge detection circuit based on a negative-edge-triggered flip-flop 802 clocked off of the system clock. In particular, the negative-edge-triggered flip-flop 802 receives input from the CDSI pin at a "D" input and the system clock at a clock input. The negative-edge-triggered flip-flop 802 produces an output Q and an inverted output $\overline{Q}$. An AND gate 804 receives input from the CDSI pin and input from the inverted output of the negative-edge-triggered flip-flop 802. The output of the AND gate 804, and, accordingly, the output of the second example structure 606B for the pulse generator 606, is the internal strobe signal CDS_strobe.

Figure 9:
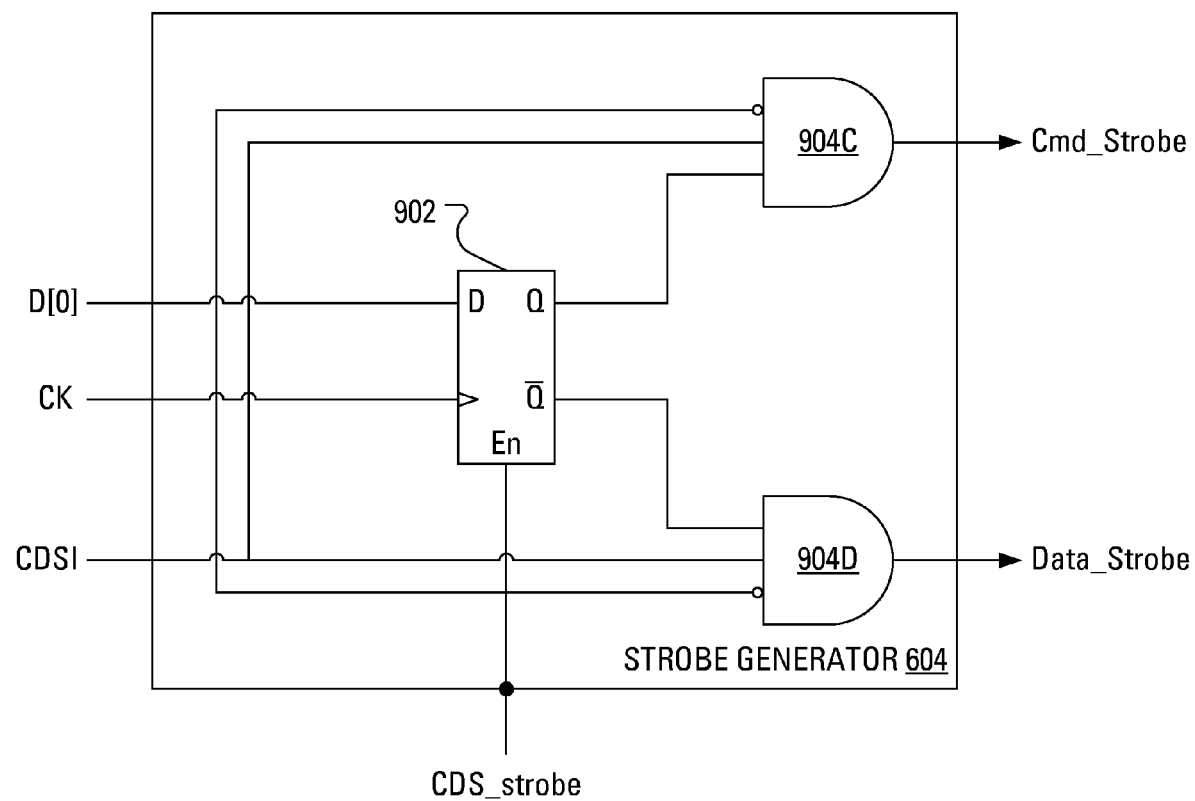
FIG. 9 illustrates a strobe generator for use in the packet header decoder of FIG. 6 according to example embodiments.

An example structure for the strobe generator 604 of FIG. 6 is illustrated in FIG. 9. The example strobe generator 604 is illustrated as implemented as an edge detection circuit based on a positive-edge-triggered flip-flop 902 clocked off of the system clock. In particular, the positive-edge-triggered flip-flop 902 receives input from the least significant data bus pin (D[0]) at a "D" input and the system clock at a clock input. The positive-edge-triggered flip-flop 902 produces an output Q and an inverted output $\overline{Q}$. A command AND gate 904C receives input from the CDSI pin, from the CDS_strobe and from the output Q of the positive-edge-triggered flip-flop 902. The output of the command AND gate 904C is the command strobe signal Cmd_Strobe. A data AND gate 904D receives input from the CDSI pin, from the CDS_strobe and from the inverted output $\overline{Q}$ of the positive-edge-triggered flip-flop 902. The output of the data AND gate 904D is the data strobe signal Data_Strobe.

In overview, the memory device arrangement 400 of FIG. 4 provides an alternative to the memory device arrangement 100 of FIG. 1. In particular, the memory device arrangement 400 of FIG. 4 provides a reduced pin count interface between the controller 402 and the first memory device 404A and between successive memory devices 404. Use, by the controller 402, of a single strobe signal that combines the function of the command strobe signal Cmd_Strobe with the function of a data strobe signal Data_Strobe facilitates the reduced pin count interface. Furthermore, a packet header is included, by the controller 402, in each primary packet provided to the data bus. Each primary packet provided to the data bus also includes a payload, whose type is identified by the packet header. Notably, in some instances, the payload is a secondary packet, which is the packet that would be transferred in a memory device arrangement having both a Cmd_Strobe signal and a Data_Strobe signal. At the memory devices 404, the packet header decoder 506, provided as illustrated in FIG. 5, acts to determine whether the secondary packet is a Read Data Packet or a Command and Write Data Packet. Dependent upon the input, the packet header decoder 506 provides either a Cmd_Strobe signal or a Data_Strobe signal to delimit the secondary packet while the secondary packet is transferred to the traditional memory device 504.

In operation, in view of FIG. 4, the controller 402 communicates with the first memory device 404A, in part, over a Command/Data Strobe Out (CDSO) pin and, in part, over a data bus (D[0:n]). The controller 402 asserts a signal on the CDSO pin and includes an encoded packet header at the beginning of that which is to be transferred over the data bus, where the encoded packet header indicates whether the assertion on the CDSO pin is to be considered to be a Command Strobe signal (Cmd_Strobe) or a Data Strobe signal (Data_Strobe).

Figure 10:
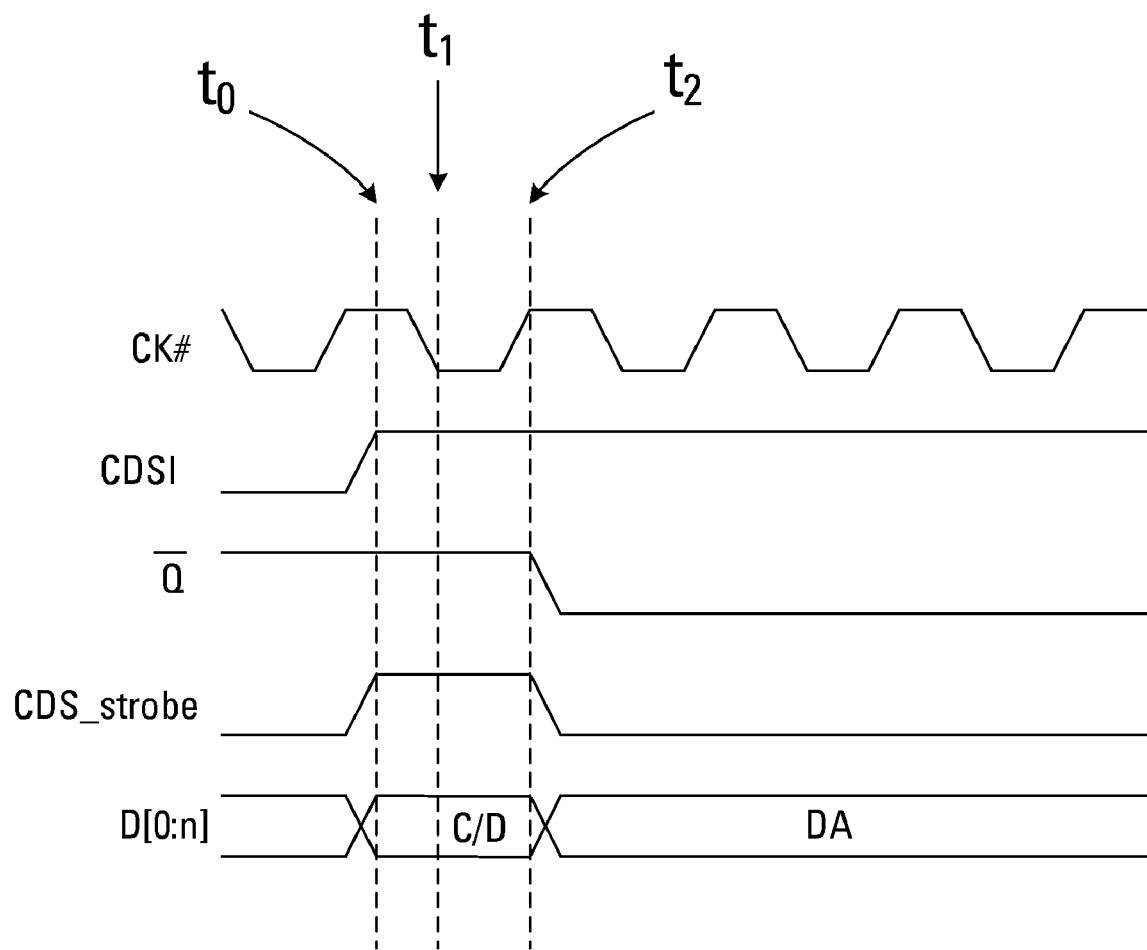
FIG. 10 illustrates a timing diagram for the first pulse generator of FIG. 7.

As discussed, the first memory device 404A may decode the header using the packet header decoder 506. A timing diagram 1000, in FIG. 10, illustrates a trace (CDSI) of a signal received at the CDSI pin of the first memory device 404A. At the pulse generator 606, the receipt of a rising edge on the CDSI pin causes the positive-edge-triggered flip-flop 702 to change state on the next rising edge of the inverse system clock CK#. In the meantime, the combination of a logical HIGH on the CDSI pin and a logical HIGH on the $\overline{Q}$ pin causes the output of the AND gate 704, i.e., the CDS_strobe, to rise to a logical HIGH (see $t_0$ in FIG. 10).

The first rising edge of the system clock while CDSI is high (see $t_1$ in FIG. 10) marks the beginning of the packet header and the point in time at which the packet type is decoded. Also, $t_1-t_0$=setup time for CDSI and D[0:n].

The output of the AND gate 704, i.e., the CDS_strobe, remains at the logical HIGH level until the positive-edge-triggered flip-flop 702 changes state, on the next rising edge of the inverse system clock CK# (see $t_2$ in FIG. 10). While the pulse generated on the CDS_strobe line lasts for less than a system clock cycle, the duration of the pulse is long enough that the value of the packet header on the data bus (D[0:n]) may be recognized by the strobe generator 604. A discussion of the mechanism by which the value of the packet header on the data bus may be recognized by the strobe generator 604 follows.

With double-data-rate (DDR) signaling and a one-bit data bus, one bit is transferred on each rising edge of the system clock and another bit is transferred on each falling edge of the system clock. On an eight-bit data bus, up to 16-bits may be transferred in a packet header with a one clock cycle duration.

Figure 11:
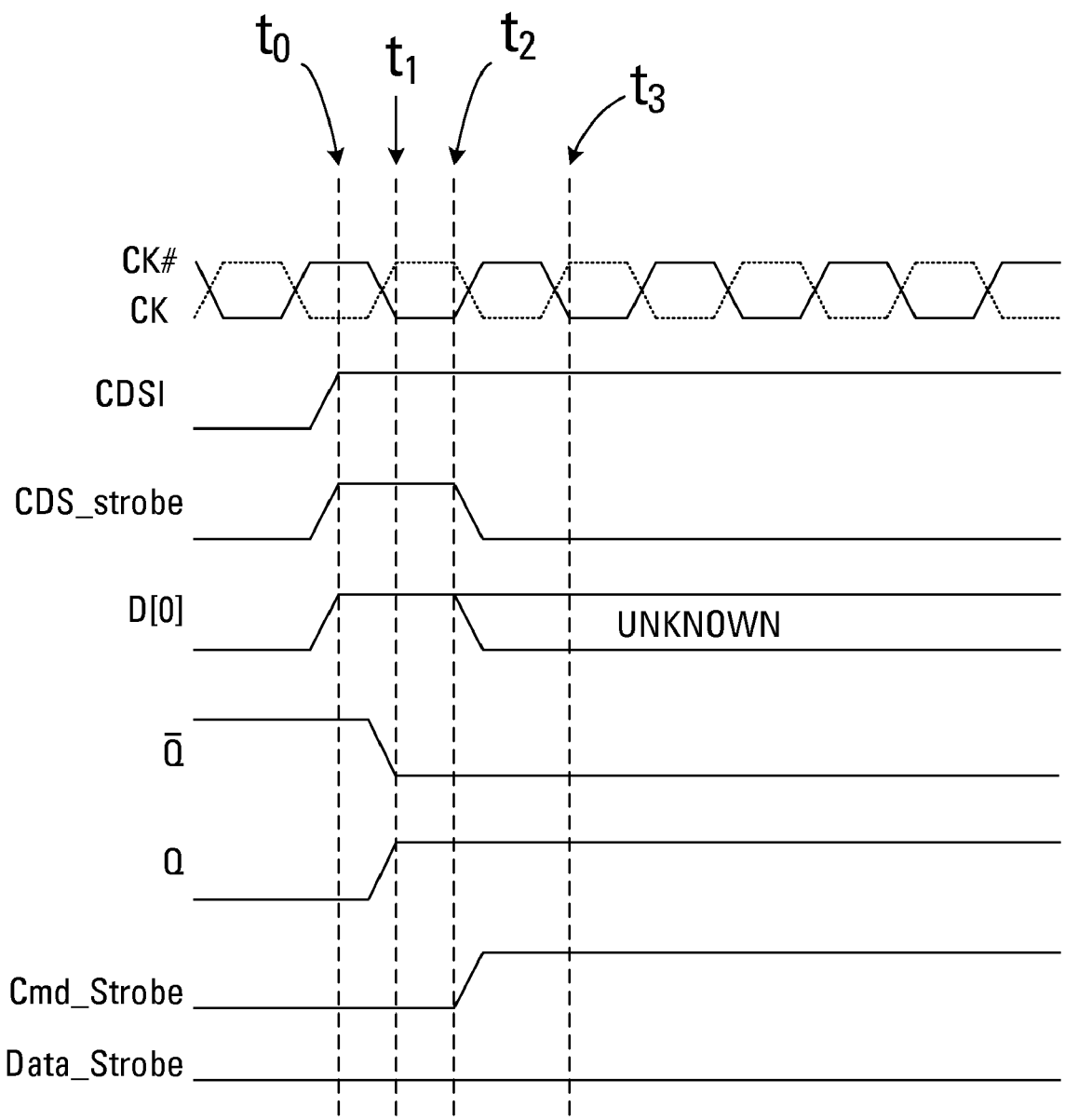
FIG. 11 illustrates a timing diagram for the strobe generator of FIG. 9.

As discussed, the strobe generator 604 is the element of the packet header decoder 506 that produces either a Cmd_Strobe signal or a Data_Strobe signal based on input from the data bus, the CDSI pin, the system clock and the CDS_strobe. A timing diagram 1100, in FIG. 11, illustrates a trace (D[0]) of the signal received from the least significant data bus pin (D[0]) at a "D" input of the positive-edge-triggered flip-flop 902. The positive-edge-triggered flip-flop 902 also receives the system clock at a clock input, which system clock is represented by a trace labeled CK. The CDS_strobe (trace labeled CDS_strobe) is received on an enable pin of the positive-edge-triggered flip-flop 902.

As an alternative to arranging the receipt of the CDS_strobe on the enable pin of the positive-edge-triggered flip-flop 902, a circuit designer could opt for a clock-gated flop-flop where the clock is gated by a control signal, such as CDS_strobe. Some application-specific integrated circuits use the clock-gated flop-flop approach to save power.

As illustrated in FIG. 11, the receipt, at the "D" input of the positive-edge-triggered flip-flop 902, of a rising edge on the D[0] pin while the system clock CK is at a logical LOW and the enable input (CDS_strobe) is also receiving a rising edge (see $t_0$ in FIG. 11) causes the positive-edge-triggered flip-flop 902 to change state on the next rising edge of the system clock CK (see $t_1$ in FIG. 11). More particularly, at $t_1$, the output Q of the positive-edge-triggered flip-flop 902 switches from logical LOW to logical HIGH and the inverted output $\overline{Q}$ switches from logical HIGH to logical LOW.

At $t_1$ in FIG. 11, the three inputs to the command AND gate 904C are HIGH (Q), HIGH (CDSI) and LOW (inverse of CDS_strobe). Consequently, the output of the command AND gate 904C (Cmd_Strobe) is LOW.

At $t_2$ in FIG. 11, the signal on CDS_strobe transitions to LOW. Accordingly, at $t_2$, the three inputs to the command AND gate 904C are HIGH (Q), HIGH (CDSI) and HIGH (inverse of CDS_strobe). Consequently, the output of the command AND gate 904C (Cmd_Strobe) transitions to HIGH.

At $t_1$ in FIG. 11, the three inputs to the data AND gate 904D are LOW ($\overline{Q}$), HIGH (CDSI) and LOW (inverse of CDS_strobe). Consequently, the output of the data AND gate 904D (Data_Strobe) is LOW.

At $t_2$ in FIG. 11, the signal on CDS_strobe transitions to LOW. Accordingly, at $t_3$, the three inputs to the data AND gate 904D are LOW ($\overline{Q}$), HIGH (CDSI) and LOW (inverse of CDS_strobe). Consequently, the output of the data AND gate 904D (Data_Strobe) remains at LOW. The secondary packet begins (is first latched) on the next rising edge of CK (see $t_3$ in FIG. 11).

Figure 12:
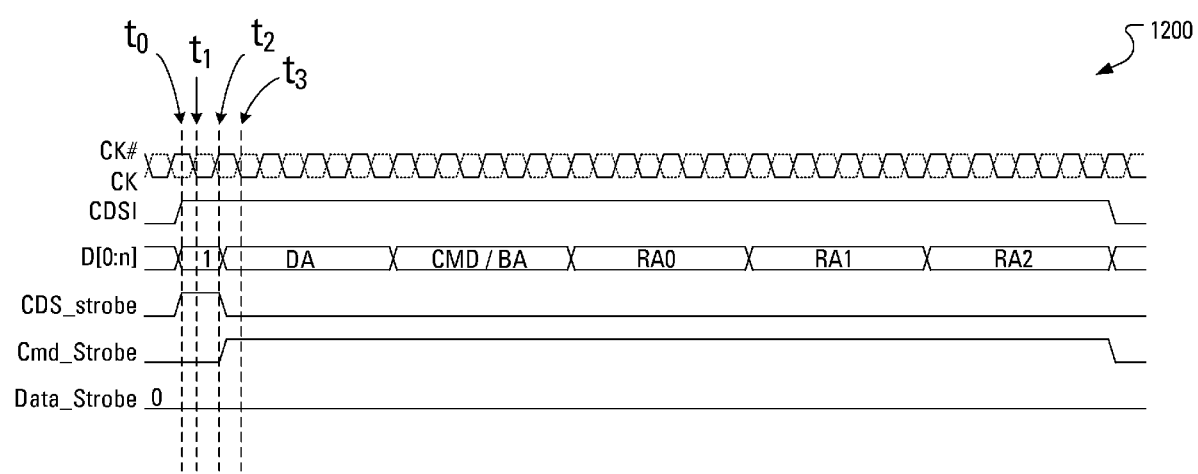
FIG. 12 illustrates a timing diagram for the handling of a Command and Write Data Packet by the memory device of FIG. 5.

A timing diagram 1200, in FIG. 12, illustrates traces for a Command and Write Data Packet. In particular, representations in FIG. 12 include the system clock signal (CK), the inverse system clock signal (CK#), the signal on the CDSI pin, multiple signals on the data bus, the CDS_strobe signal, the Cmd_Strobe signal and the Data_Strobe signal. At to, the CDSI signal is asserted by the controller 102 and the CDS_strobe signal is asserted by the pulse generator 606. The first rising edge of the system clock while CDSI is high (see $t_1$ in FIG. 12) marks the beginning of the packet header and the point in time at which the secondary packet type is decoded.

At $t_2$, namely, the rising edge of the inverse system clock, the CDS_strobe signal is de-asserted by the pulse generator 606 and, since the packet header contained a 1 corresponding to the presence, on the data bus, of a Command and Write Data Packet, the Cmd_Strobe is asserted by the strobe generator 604. It should be clear that the assertion of the CDS_strobe by the pulse generator 606 allows the strobe generator 604 to use the packet header to appropriately assert either the Cmd_Strobe or the Data Strobe. Notably, the Cmd_Strobe remains asserted as long as CDSI is asserted, thereby delimiting the Command and Write Data Packet on D[0:n], which Command and Write Data Packet includes a device address (DA), a command or Bank Address (CMD/BA), a first Row Address (RA0), a second Row Address (RA1) and a third Row Address (RA2). The secondary packet begins (is first latched) on the next rising edge of CK (see $t_3$ in FIG. 12).

Figure 13:
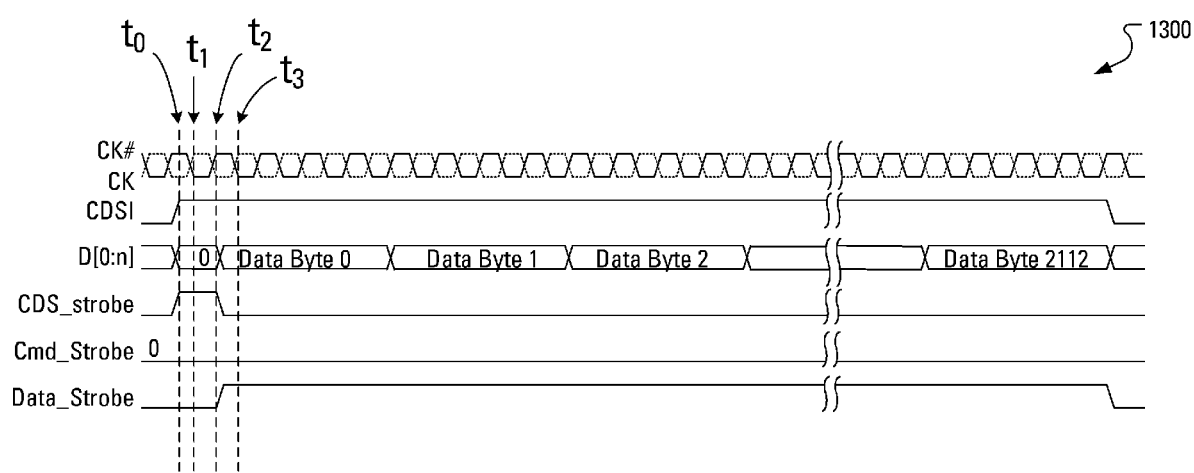
FIG. 13 illustrates a timing diagram for the handling of a Read Data Packet by the memory device of FIG. 5.

A timing diagram 1300, in FIG. 13, illustrates traces for a Read Data Packet. In particular, representations in FIG. 13 include the system clock signal (CK), the inverse system clock signal (CK#), the signal on the CDSI pin, multiple signals on the data bus, the CDS_strobe signal, the Cmd_Strobe signal and the Data_Strobe signal. At to, both the CDSI signal and the CDS_strobe signal are asserted. At $t_2$, namely, the rising edge of the inverse system clock, the CDS_strobe signal is de-asserted and, since the packet header contained a 0 corresponding to a Read Data Packet, the Data Strobe is asserted. It should be clear that the assertion of the CDS_strobe by the pulse generator 606 allows the strobe generator 604 to use the packet header to appropriately assert either the Cmd_Strobe or the Data_Strobe. Notably, the Data_Strobe remains asserted as long as CDSI is asserted, thereby delimiting the Read Data Packet on D[0:n], which Read Data Packet includes a Data Byte 0, a Data Byte 1, Data Byte 2, . . . , and a Data Byte 2112.

In review, the information carried by the packet header indicates the type of the secondary packet that follows the packet header. Instead of the first memory device 404A receiving two strobe signals, i.e., a Cmd_Strobe at a CSI pin and a Data_Strobe at a DSI pin, as illustrated in FIG. 1, the controller 402 in the arrangement 400 illustrated in FIG. 4 combines the two strobe signals into a single strobe signal, which is received by the first memory device 404A at a CDSI pin. Concurrently with receiving an assertion on the CDSI pin, the first memory device 404A receives, on the data bus, encoded information in a header that precedes normally used packets. The encoded information is representative of the information lost by the reduction in the number of strobe signals from two to one. Aspects of the present application relate to providing the traditional memory device 504 with external logic devices, represented by the strobe generator 604 and the pulse generator 606, thereby permitting single strobe operation.

The encoded information in the header indicates whether the secondary packet is a Command and Write Data Packet or a Read Data Packet, thereby providing all the information that was communicated by the original two strobe signals.

The above-described embodiments of the present application are intended to be examples only. Alterations, modifications and variations may be effected to the particular embodiments by those skilled in the art without departing from the scope of the application, which is defined by the claims appended hereto.

What is claimed is:

1. A memory device comprising:
an internal memory device including:
a plurality of data bus inputs for receiving a signal on a data bus;
a first strobe input for receiving a first strobe signal indicating that said signal on said data bus relates to a first type of packet; and
a second strobe input for receiving a second strobe signal indicating that said signal on said data bus relates to a second type of packet; and
a packet header decoder including:
a data bus input for receiving a portion of said signal on said data bus;
a third strobe input for receiving a third strobe signal;
a pulse generator for generating a fourth strobe signal based, at least in part, on said third strobe signal; and
a strobe generator for generating one of said first strobe signal and said second strobe signal based, at least in part, on:
said portion of said signal on said data bus; and
said fourth strobe signal.

2. The memory device of claim 1 wherein said first type of packet is a Command and Write Data Packet.

3. The memory device of claim 1 wherein said second type of packet is a Read Data Packet.

4. The memory device of claim 1 wherein said packet header decoder comprises a clock input for receiving a system clock signal.

5. The memory device of claim 4 wherein said second strobe signal is based, at least in part, on said system clock signal.

6. The memory device of claim 4 wherein said pulse generator comprises:

a negative-edge-triggered flip-flop for:
receiving said system clock signal at a clock input and said third strobe signal at a D input; and
generating an output signal and an inverse output signal;
a logic circuit for producing said fourth strobe signal based on said inverse output signal and said third strobe signal.

7. The memory device of claim 6 wherein said logic gate for producing said fourth strobe signal is arranged to perform a logical AND operation.

8. The memory device of claim 4 wherein said strobe generator comprises:
a positive-edge-triggered flip-flop for:
receiving said system clock signal at a clock input, said portion of said signal on said data bus at a D input and said fourth strobe signal at an enable input; and
generating an output signal and an inverse output signal;
a first logic circuit for producing said first strobe signal based on said output signal, said third strobe signal and an inverse of said fourth strobe signal.

9. The memory device of claim 8 wherein said first logic gate for producing said first strobe signal is arranged to perform a logical AND operation.

10. The memory device of claim 8 further comprising a second logic circuit for producing said second strobe signal based on said inverse output signal, said third strobe signal and an inverse of said fourth strobe signal.

11. The memory device of claim 10 wherein said second logic circuit for producing said second strobe signal is arranged to perform a logical AND operation.

12. The memory device of claim 1 wherein said packet header decoder comprises an inverse clock input for receiving an inverse system clock signal.

13. The memory device of claim 12 wherein said pulse generator is for generating said fourth strobe signal based, at least in part, on said inverse system clock signal.

14. The memory device of claim 12 wherein said pulse generator comprises:
a positive-edge-triggered flip-flop for:
receiving said inverse system clock signal at a clock input and said third strobe signal at a D input; and
generating an output signal and an inverse output signal; and
a logic circuit for producing said fourth strobe signal based on said inverse output signal and said third strobe signal.

15. The memory device of claim 14 wherein said logic circuit for producing said fourth strobe signal is arranged to perform a logical AND operation.

16. A memory arrangement comprising:
a memory controller including:
a strobe output for transmitting a third strobe signal delimiting a primary packet; and
a plurality of data bus outputs for transmitting said primary packet on a data bus, said primary packet including a packet header followed by a payload, said packet header indicating a type to be associated with said payload; and
a memory device comprising:
an internal memory device including:
a plurality of data bus inputs for receiving said primary packet on said data bus;
a first strobe input for receiving a first strobe signal indicating that said signal on said data bus relates to a first type of packet; and
a second strobe input for receiving a second strobe signal indicating that said signal on said data bus relates to a second type of packet; and a packet header decoder including:
- a data bus input for receiving a portion of said primary packet on said data bus;
- a third strobe input for receiving said third strobe signal;
- a pulse generator for generating a fourth strobe signal based, at least in part, on said third strobe signal; and
- a strobe generator for generating one of said first strobe signal and said second strobe signal based, at least in part, on:
  - said portion of said primary packet on said data bus; and
  - said fourth strobe signal.

17. The memory arrangement of claim 16 wherein said first type of packet is a Command and Write Data Packet.

18. The memory arrangement of claim 16 wherein said second type of packet is a Read Data Packet.

19. The memory arrangement of claim 16 wherein:
- said packet header decoder comprises a clock input for receiving a system clock signal; and
- said second strobe signal is based, at least in part, on said system clock signal.

20. The arrangement device of claim 16 wherein:
- said packet header decoder comprises an inverse clock input for receiving an inverse system clock signal; and
- said pulse generator is for generating said fourth strobe signal based, at least in part, on said inverse system clock signal.

* * * * *